United States Patent [19]

Luce

[11] 4,128,764

[45] Dec. 5, 1978

[54] COLLECTIVE FIELD ACCELERATOR

[75] Inventor: John S. Luce, Livermore, Calif.

[73] Assignee: The United States of America as represented by the United States Department of Energy, Washington, D.C.

[21] Appl. No.: 825,504

[22] Filed: Aug. 17, 1977

[51] Int. Cl.[2] .............................................. H01J 37/00

[52] U.S. Cl. ............................ 250/398; 250/396 ML; 250/423 R

[58] Field of Search ........... 250/396 R, 396 ML, 398, 250/423 R, 492 A, 505; 313/361, 363, 442; 176/11

[56] References Cited

U.S. PATENT DOCUMENTS

| | | | |
|---|---|---|---|
| 2,941,077 | 6/1960 | Marker | 250/396 |
| 3,212,974 | 10/1965 | LeBoutet et al. | 250/423 |
| 3,892,970 | 7/1975 | Freeman et al. | 250/398 |

FOREIGN PATENT DOCUMENTS

| | | | |
|---|---|---|---|
| 1304893 | 1/1973 | United Kingdom | 250/396 ML |

*Primary Examiner*—Bruce C. Anderson
*Attorney, Agent, or Firm*—Dean E. Carlson; Roger S. Gaither; L. E. Carnahan

[57] ABSTRACT

A collective field accelerator which operates with a vacuum diode and utilizes a grooved cathode and a dielectric anode that operates with a relativistic electron beam with a $\nu/\gamma$ of $\sim 1$, and a plurality of dielectric lenses having an axial magnetic field thereabout to focus the collectively accelerated electrons and ions which are ejected from the anode. The anode and lenses operate as unoptimized r-f cavities which modulate and focus the beam.

8 Claims, 1 Drawing Figure

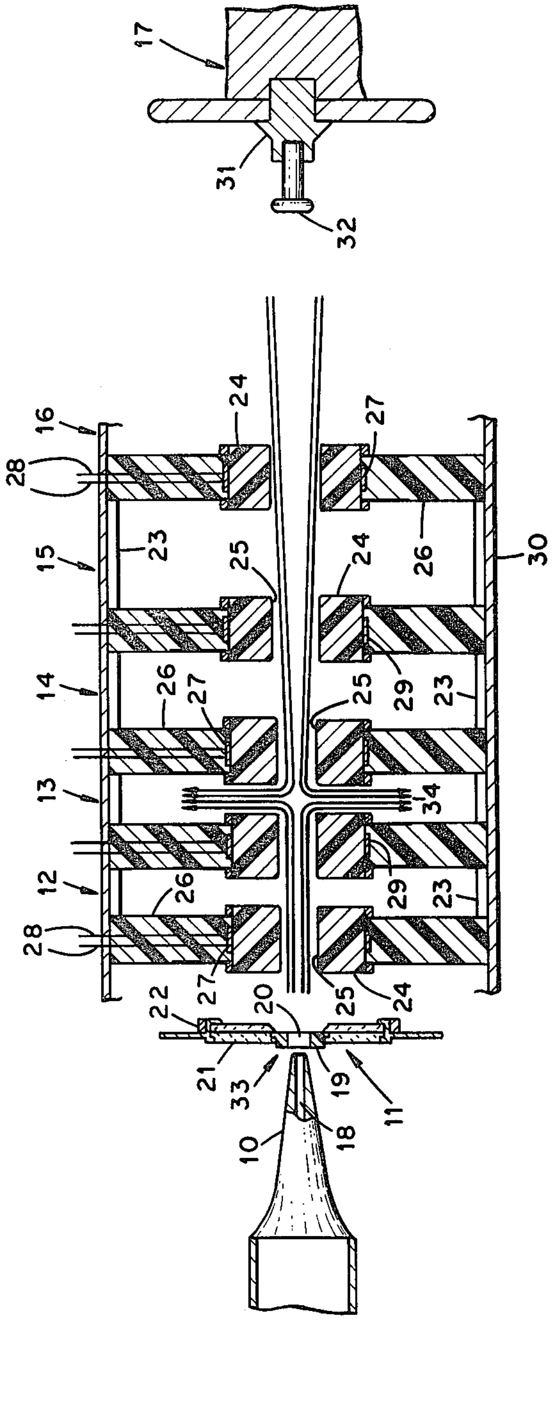
17
31
32
16
24
27
28
15
23
25
24
26
30
14
26
27
25
29
23
13
34
12
26
29
23
28
27
25
24
22
20
21
33
19
11
10
18

COLLECTIVE FIELD ACCELERATOR

BACKGROUND OF THE INVENTION

The invention described herein was made at the Lawrence Livermore Laboratory under Contract No. W-7405-ENG-48 between the United States Energy Research and Development Administration and the University of California.

The invention relates to a collective field acceleration apparatus, and more particularly to such an apparatus for enhanced collective field acceleration through plasma vortex filament focusing.

The linear, collective field acceleration of positive ions by electrons is a subject of great concern to researchers needing intense ion or radiation sources (neutrons, X-rays, etc.) as well as to those interested in possible fusion energy applications. Since 1961 when the first linear, collective field acceleration was reported, the developments may be divided into three categories: 1) plasma filled diodes, 2) vacuum diodes, and 3) drifting beams in pressurized gases. Collective field accelerators have been developed which operate with a vacuum diode, as exemplified by an article by J. S. Luce et al. entitled "Collective Acceleration of Intense Ion Beams in Vacuum" published in IEEE Trans. Nucl. Sci. NS-20 (3) June 1973. However, means for utilizing vortex filament properties had not been developed at that time.

SUMMARY OF THE INVENTION

The present invention is a collective field accelerator which operates with a vacuum diode utilizing a relativistic electron beam and means which modulate and focus the beam. Enhanced collective field acceleration is accomplished by the present invention through plasma vortex filament focusing wherein a grooved cathode tip helps form and guide filamentary current carriers toward the vacuum diode target. Past the dielectric anode the collection of filamentary current carriers pass through a series of dielectric lenses with associated magnetic coils for imposing an axial magnetic field to enhance ion acceleration. The magnetic field coils may be used to set up cusps for further guiding or containment and compression of a pellet or a plasma target. Preliminary experiments show at least a 10% gain in ion energy due to imposed $B_2$ field. The collective field accelerator of the present invention uses a tapered cathode having grooves thereon that help form filamentary current carriers which may be guided through an anode, having an opening therein, and beyond in such a manner as to deposit more than twice as much ion energy on the target as without the grooved cathode. The dielectric lenses act similar to the anode in that they too form a local plasma when irradiated by the electrons from the vacuum diode. These dielectric lenses then focus the beam by electrostatic or electromagnetic focusing. Relativistic electrons of one to six MeV have been used in these experiments.

Therefore, it is an object of this invention to provide a collective field accelerator.

A further object of the invention is to provide a collective field accelerator which operates with a vacuum diode wherein vacuum operation eliminates many problems encountered in higher pressure operation.

Another object of the invention is to provide enhanced collective field acceleration through plasma vortex filament control.

Another object of the invention is to provide a collective field accelerator which utilizes a grooved cathode, a dielectric anode, and a plurality of dielectric lenses.

Another object of the invention is to provide a collective field accelerator which enhances acceleration through plasma vortex current carrier filament focusing and operates with a relativistic electron beam.

Other objects of the invention will become readily apparent from the following description and accompanying drawing.

BRIEF DESCRIPTION OF THE DRAWING

The single FIGURE illustrates a cross-sectional view of the present invention.

DESCRIPTION OF THE INVENTION

The present invention is directed to an apparatus for enhancing collective field acceleration through plasma vortex filament focusing, and thus comprises a collective field accelerator which operates with a vacuum diode using a grooved cathode, highly insulated anode, and a plurality of dielectric lenses that operates with a relativistic electron beam of several MeV. The potential of the anode varies rapidly such that the vacuum diode part of the invention could be described as a pulsed anode accelerator that operates in a vacuum. The tapered cathode having grooves thereon functions to help form filamentary current carriers which may be guided through the anode and beyond in such a manner as to deposit about twice as much ion energy on the target as without the grooved cathode. The dielectric lenses act like the anode in that they form a local plasma when they are impinged by the electrons from the vacuum diode. These dielectric lenses focus the beam by electrostatic and electromagnetic forces. The present invention makes efficient use of the filament current carriers and involves the use of relativistic electrons of one to six MeV electrons. Higher voltage will be used in the future.

Setting a strong axial magnetic field is a non-obvious way to accelerate positive ions in the field direction. Magnetic field forces are perpendicular to the magnetic field. The present invention includes magnetic coils to generate an axial magnetic field. Within each filament where the electron current is concentrated the electron velocities vary from nearly axial at the center to approaching perpendicularity at the periphery. Vorticity $w = \frac{1}{2} \nabla \times U_e$, where $\nabla$ = gradient operator, and where $U_e$ = electron mean velocity, and self-consistent magnetic fields are simultaneously generated in the same location to form a filament. The electron flow with this vorticity w generates an axial magnetic field in the filament. A linear combination of w and B, where B = total magnetic field in the filament region (i.e., self field and magnetic-coil field) is preserved, leading one to attempt to increase B in order to increase w. An increase of the magnitude of w increases the stability of the filaments and sharpens the boundary between region of low density current with low B, w amplitudes and filament region with peak values of B, w and of current density. This sharp variation of B is effective in accelerating the ions moving in the collective field with the electrons. An applied, axial magnetic field would be generally in the filament's direction of propagation, especially with the introduction of electrostatic focusing by the dielectric lenses. This external magnetic field would add to the magnetic field seen by the electrons with the vorticity w increasing. As w increases so does the acceleration of the ions. The exact accelerating mechanism which produces high energy ions in the collective field accelerator is not well understood however. Though in addition an applied axial magnetic field improves focusing and reduces instabilities and turbulence.

Referring now to the drawing, the collective field accleration apparatus basically comprises a tapered cathode 10, an anode assembly, indicated generally at 11, a plurality of dielectric focusing lens assemblies indicated generally at 12–16, and a target assembly indicated generally at 17. Cathode 10 is of a tapered configuration, provided with grooves 18, and constructed of graphite, for example. Anode assembly 11 comprises anode 19 having an aperture or hole 20 of 1 cm diameter and constructed of plastic of various kinds depending upon the ions desired, for example, placed symmetrically around the longitudinal axis of the apparatus, and held in place by a concentric insulated anode holder 21 which is supported around the periphery thereof by a ground ring and clamp mechanism 22.

The dielectric focusing lens assemblies 12–16 are positioned in varying spaced relationship by variable spacers 23 along the longitudinal axis between anode assembly 11 and target assembly 17, with lens assemblies, 12, 13 and 14 being spaced at equal distances along the axis, with an increasingly greater distance between each of lens assemblies 15 and 16 compared to that of the preceding lens assembly. For example, there are distances of 625 $\mu$m between the adjacent lens assemblies as viewed from left to right. Each dielectric focusing lens assembly 12–16 comprises a focusing lens 24, constructed of a suitable plastic, for example, having an opening 25, a support member 26, constructed of plastic, for example, and surrounded by pulse or magnetic field coils 27, having lead lines 28 connected to a power source, not shown, located in countersink areas 29 in the standoffs or support members 26 such that they are next to the periphery of the focusing lens 24, but not openly exposed to the accelerator particle flux passing through the openings 25 in lens 24. The variable spacers 23 are constructed of aluminum, for example, and fit concentrically just inside a metal tube 30 which may be constructed of aluminum, or other conductor material, for example. The pulse of magnetic field coils 27 may, for example, consist of 10 turn of 1 mm diameter wire constructed of copper material, with a power supply of 5000 volts connected thereto. Placed at a desired distance from lens assembly 16 is the target assembly 17 including a holder 31 and a target 32 constructed of graphite and plastic, for example, with the target 32 centered on the longitudinal axis of the apparatus. Note that the opening 25 of the lens 24 in each of lens assemblies 15 and 16 is larger (diameter of 6.25 cm) than the openings 25 in the lens assemblies 12, 13 and 14 (diameter of 7.5 cm), the purpose of which will be described hereinafter.

In operation, for example, wherein an e-beam machine delivers 2.5 kJ at 1 MV to the vacuum diode in 50 ns, the apparatus illustrated functions as follows: The electrons start moving on the cathode 10 and in this process the grooves 18 in the cathode help guide the electrons so that they form filament current carriers. While moving on the cathode the electrons are space-charge neutralized. However, upon leaving the cathode and entering a vacuum gap 33, space-charge neutralization is diminished and the electron stream expands with a portion striking the inside of the dielectric anode hole 19 which produces a plasma pulse. Ions from the plasma neutralize the electron space charge, and the beam compresses and flows through the anode hole 20. This process occurs several times during one machine pulse producing a number of electron pulses. Only one ion pulse is observed. Ions are trapped by the space charge process and are accelerated, perhaps with the propagation velocity of the current carrier filaments which are formed on the cathode. Past the dielectric anode 19, the current carrier filaments enter the region of the dielectric lens assemblies 12–16. Electrons from the beam strike each of the focusing lens 24 causing a local plasma to form. Thus the filaments are electrostatically focused. At the same time pulsed current is supplied to the magnetic field coils 27 which create an external axial magnetic field to enhance collective ion acceleration. The spacing, via spacers 23, between the lenses 24 may be varied, which also varies the spacing between the magnetic field coils 27. Sections of this axial magnetic field may be reversed to form one or more magnetic cusps, indicated at 34, for focusing or for containment in pellet or plasma compression applications. The target 32 may be of any conventional material used in vacuum diode experiments. The hypothesis that dielectric lenses act as r-f cavities can be explored by this apparatus to attain r-f acceleration as well.

It has thus been shown that the invention provides a collective field accelerator which operates with a vacuum diode and utilizes a grooved cathode and a dielectric anode that operates with a relativistic electron beam with a $\nu/\gamma$ of $\sim$ 1, and a plurality of dielectric lenses having an axial magnetic field thereabout to focus the collectively accelerated electrons and ions which are ejected from the anode. Thus, in addition to the grooved cathode to enhance and guide filamentary current carriers, the invention involves the dielectric lenses and associated magnetic coils for increased acceleration by the axial magnetic field to guide or contain and compress a pellet or a plasma target. The grooved cathode of the invention has shown a two-fold increase of energy delivered to the target over energy deposited with an ungrooved cathode. Tests have shown that a pulsed $B_2$ field does enhance the acceleration process. Accordingly, the present invention may be employed as a neutron or ion accelerator as well as a fusion energy source, in addition to its plasma generating capabilities.

While a particular embodiment of the invention has been illustrated or described, modifications and changes will become apparent to those skilled in the art, and it is intended to cover in the appended claims, all such modifications and changes as come within the spirit and scope of the invention.

What I claim is:

1. A collective field accelerator in combination with a vacuum diode adapted to operate with a relativistic electron beam with a $\nu/\gamma$ of $\sim$ 1; said vacuum diode comprising a tapered, grooved cathode and an insulated anode assembly having a central hole therein; said collective field accelerator comprising a plurality of spaced focusing lens assemblies having means for producing an axial magnetic field thereabout for focusing plasma vortex filaments made of collectively accelerated electrons and ions which are ejected from said anode assembly onto an associated target; said cathode, anode assembly and focusing lens assemblies being located on a longitudinally extending axis.

2. The combination defined in claim 1, wherein said insulated anode assembly is composed of a dielectric anode having an aperture therein defining said central hole and positioned symmetrically around said axis by a concentric insulated holder and in alignment with said focusing lens assemblies, said insulated holder being secured to a ground ring and clamp mechanism.

3. The collective field accelerator defined in claim 1, wherein each of said focusing lens assemblies comprises a focusing lens having an opening therein, a support member for maintaining said opening in axial alignment along said axis, and a magnetic field coil positioned about the periphery of said focusing lens.

4. The collective field accelerator defined in claim 3, wherein said support member is provided with a groove adjacent said focusing lens, and wherein said coil is located in said groove.

5. The collective field accelerator defined in claim 1, additionally including spacer means located intermediate each of said plurality of focusing lens assemblies, and tube means containing said focusing lens assemblies and said spacer means.

6. The collective field accelerator defined in claim 1, wherein said plurality of focusing lens assemblies comprises five axially aligned lens assemblies, wherein two lens assemblies located a greatest distance from said anode assembly are spaced a greater distance apart compared to spacing between the other three lens assemblies.

7. The collective field accelerator defined in claim 6, wherein each of said focusing lens assemblies includes a focusing lens having an opening therein, and wherein said opening in each of said two lens assembies is of a greater diameter than that of the openings in said other three lens assemblies.

8. The combination defined in claim 7, wherein said tapered, grooved cathode is composed of graphite, and wherein each of said focusing lens is supported by a support standoff constructed of material selected from the group consisting of plastic and carbon.

* * * * *